United States Patent
Bilic et al.

(10) Patent No.: US 9,199,840 B2
(45) Date of Patent: Dec. 1, 2015

(54) SENSOR PROTECTIVE COATING

(71) Applicants: Dubravka Bilic, Scottsdale, AZ (US); Stephen R. Hooper, Mesa, AZ (US)

(72) Inventors: Dubravka Bilic, Scottsdale, AZ (US); Stephen R. Hooper, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 14/069,633

(22) Filed: Nov. 1, 2013

(65) Prior Publication Data
US 2015/0123222 A1 May 7, 2015

(51) Int. Cl.
*H01L 21/00* (2006.01)
*G01L 9/00* (2006.01)
*B81C 1/00* (2006.01)
*B81B 7/00* (2006.01)

(52) U.S. Cl.
CPC ........... *B81C 1/00825* (2013.01); *B81B 7/0058* (2013.01); *B81B 2201/0264* (2013.01)

(58) Field of Classification Search
CPC .......................... G01L 9/0048; B81C 1/00825
USPC ........................ 257/254, 415–419; 438/50–53
See application file for complete search history.

(56) References Cited

U.S. PATENT DOCUMENTS

| | | | |
|---|---|---|---|
| 6,063,696 A | 5/2000 | Brenner et al. | |
| 6,465,327 B1 | 10/2002 | Aspar et al. | |
| 6,582,983 B1 | 6/2003 | Runyon et al. | |
| 7,129,459 B2 * | 10/2006 | Ma et al. | 250/208.1 |
| 7,297,567 B2 | 11/2007 | Loeppert | |
| 7,923,793 B2 * | 4/2011 | Choi et al. | 257/415 |
| 7,977,786 B2 | 7/2011 | Ridley et al. | |
| 8,696,917 B2 * | 4/2014 | Petisce et al. | 216/13 |

OTHER PUBLICATIONS

Kuan-Hsuan Ho, "Debris Reduction in GaAs Wafer Dicing Process", CS Mantech Conference, May 17-20, 2010, 4 pages.

\* cited by examiner

*Primary Examiner* — Calvin Lee
(74) *Attorney, Agent, or Firm* — Lempia Summerfield Katz LLC

(57) ABSTRACT

A method of fabricating a sensor device includes forming a plurality of sensor structures on a wafer, covering the plurality of sensor structures with a polymer layer, and dicing the wafer into a plurality of die while each sensor structure remains covered by the polymer layer.

20 Claims, 3 Drawing Sheets

007# SENSOR PROTECTIVE COATING

FIELD OF INVENTION

The present embodiments relate to microelectromechanical system (MEMS) sensor devices, and methods of their fabrication.

BACKGROUND

Microelectromechanical system (MEMS) sensor devices are often sealed within a cavity to protect fragile, moving structures. But some types of MEMS sensor devices are designed to be unsealed to enable the structures to interact with the surrounding environment. For example, a diaphragm of a MEMS capacitive pressure sensor device is typically exposed to the surrounding environment in the interest of developing an accurate indication of the ambient pressure level.

MEMS sensor devices are usually fabricated via surface micromachining procedures. The procedures are configured to produce mass quantities of the MEMS sensor devices on a wafer. The wafer is eventually sawed or diced into numerous individual die. Water is often used to cool the saw blade during dicing. Water may also be applied to the wafer to remove debris generated during dicing.

When MEMS sensor devices lack a protective cavity, the water used for saw blade cooling and wafer cleaning may impinge upon the fragile structures of the sensor devices. MEMS device structures, such as pressure sensor diaphragms, may be damaged as a result of such contact with the water or other debris created during the dicing process.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
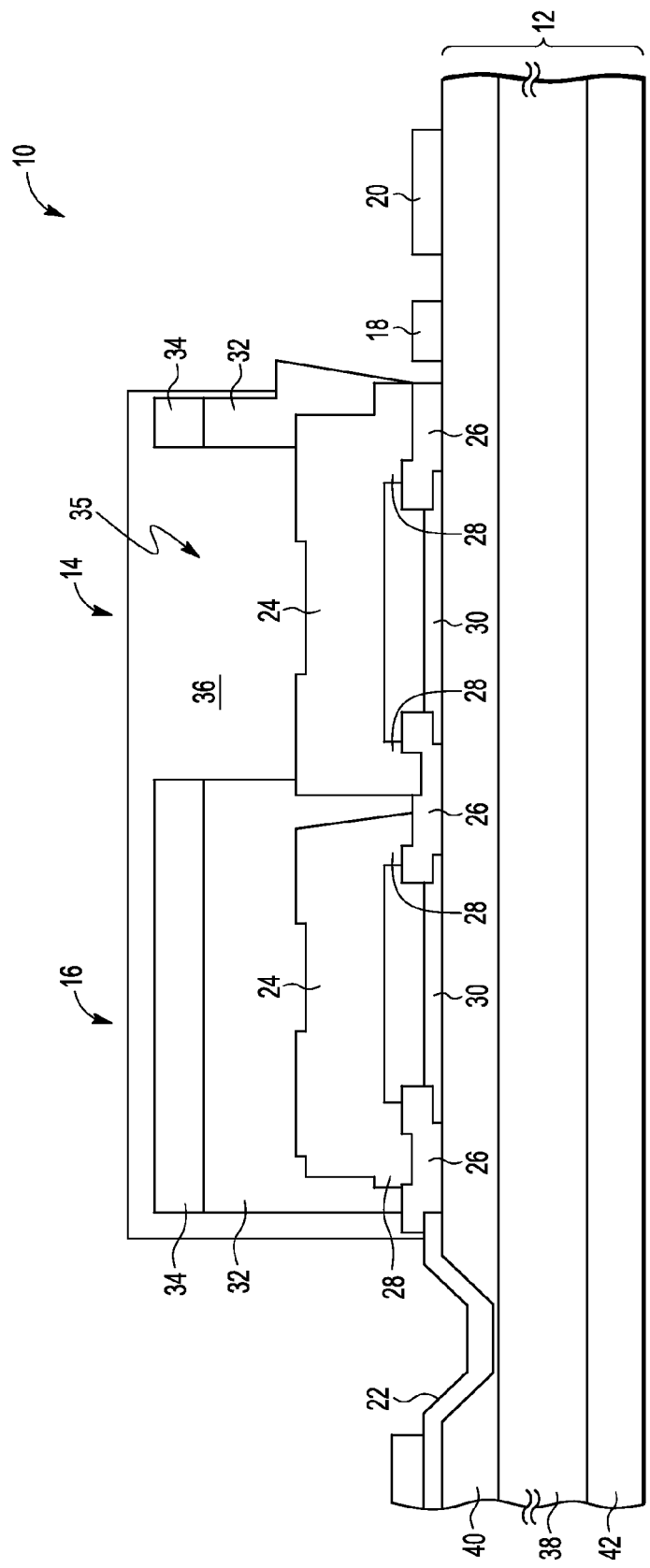
FIG. 1 is a schematic, simplified, cross-sectional view of a sensor device having a protective coating or layer of a polymer material in accordance with one embodiment.

Sensor device fabrication methods that protect fragile sensor components with a polymer coating or layer are described. Sensor devices fabricated in accordance with the fabrication methods are also described. In some embodiments, the polymer layer includes a photoresist material. The polymer coating protects the fragile sensor components during a dicing or saw process. The polymer coating may buffer the sensor components from the water used to cool the saw blade and/or clean the wafer during the dicing process, and/or buffer the components from debris created during the dicing process. The polymer coating may thus reduce or prevent cracking or fracture of sensor components either during fabrication (e.g., dicing and die assembly) or afterward (e.g., during use or handling in the field).

The sensor devices may lack a cap or other cavity-defining structure that would otherwise protect the components from the water. The fragile sensor components may be exposed to the environment by design. For example, the sensor device may be a MEMS pressure sensor having an exposed diaphragm to measure the ambient pressure level.

The polymer coating may alternatively or additionally reduce or prevent cracking from vibration. The sensor components may be released from the substrate or wafer for movement relative thereto. Once released, the sensor components are suspended or otherwise spaced from the substrate. The sensor components may be configured to deflect or bend relative to the substrate. Vibrations during the dicing process and/or other handling may cause the component to deflect or bend in an undesired manner, causing cracks to form. The polymer coating may dampen or reduce such vibrations.

The cracking reduced or prevented by the disclosed embodiments may be difficult to detect. The fractures may be partial or complete. Functional testing may thus not reveal the presence of the fractures. The sensor devices may not fail until the cracking propagates or otherwise worsens during use in the field or other handling. Eventually, the cracking may lead to a loss of hermeticity for the cavity between a membrane (e.g., a pressure sensor diaphragm) and a substrate. The size of the fractures may be such that the cracks can only be seen with a microscope after decoration. The disclosed embodiments may thus avoid the need for screening procedures, thereby beneficially saving time and resources during fabrication.

The disclosed embodiments may include patterning of the polymer layer. Photoresist or other polymer material(s) may be spun onto the wafer and subsequently processed, e.g., via photolithography, for patterning. The patterning may remove the polymer layer in selected areas, such as along scribe lines and/or bond pads.

The disclosed embodiments may include complete removal of the polymer layer after the dicing process. For example, the polymer layer may be removed after a die assembly process (e.g., die bonding). The removal of the polymer layer may involve, for instance, a plasma etch. In some cases, however, device structures or components may remain covered by the polymer layer throughout the remainder of the assembly and fabrication process and during use.

Although described below in connection with MEMS pressure sensor device examples, the disclosed embodiments may be useful in connection with fabricating various types of sensor devices. The sensor devices of the disclosed embodiments may include sensors other than pressure sensors. For example, the disclosed embodiments may be applied in the context of a MEMS strain gauge or an uncapped MEMS accelerometer. The disclosed embodiments may be useful in connection with any known or hereafter developed sensor devices having components or structures that are exposed to ambient during the dicing or sawing process, including those structures that are released prior to the dicing process. The disclosed embodiments may also be used in connection with sensors without components or structures that are exposed to ambient.

The sensor devices are also not limited to MEMS sensors or devices. For example, the coating of sensor structures may be applied in the context of piezoelectric or other structures. The disclosed embodiments are also not limited to sensor devices having a single sensor and/or single type of sensor. The number of sensors or sensor types within the sensor device may thus vary.

The disclosed embodiments are compatible with various packaging technologies and processes. For example, the sensor devices may be deployed in chip-scale packaging arrangements. The sensor devices may be subsequently attached to a circuit board using various solders, such as tin-lead (SnPb) eutectic solder and Pb-free solders. The sensors of the disclosed embodiments may be overmolded and deployed in accordance with surface mount technologies, such as quad flat no leads (QFN) packaging and land grid array (LGA) packaging. The sensors may be mounted in other types of packages. For example, the sensors may be packaged as a small outline integrated circuit (SOIC).

FIG. 1 is a cross-sectional view of a sensor device 10 that includes a substrate 12 and a number of sensor structures supported by the substrate 12. The sensor device 10 is configured as a pressure sensor device. In this example, the sensor structures are configured in a multiple-cell arrangement, including a pressure sensor cell 14 and a reference pressure sensor cell 16 of the sensor device 10. The sensor device 10 also includes a number of interconnects 18 and a number of bond pads 20 to provide, e.g., bias voltages, for the sensor device 10 and carry signals to and/or from the sensor device 10. The interconnects 18 and the bond pads 20 are supported by the substrate 12 but otherwise shown in simplified form. The interconnects 18 and the bond pads 20 may be electrically connected with the sensor structures of the sensor device 10 at a location outside of the depicted cross-section.

The sensor device 10 is depicted in FIG. 1 before a dicing process in which a die having the sensor device 10 is formed. A number of scribe lines (or lanes) 22 may be formed at the surface of the substrate 12 to facilitate the dicing process. The scribe lines 22 may form a scribe grid that defines the plurality of die to be formed from a wafer. Each scribe line 22 is shown in simplified form, and may include a groove in the substrate 12. The groove may be deep enough to extend through an oxide or other surface layer of the substrate 12 and thereby a reach a bulk semiconductor portion of the substrate 12. The groove may be filled, e.g., partially filled, with a material (e.g., polysilicon) for saw alignment and/or other purposes. The configuration and other characteristics of the scribe lines 22 may vary.

The sensor structures of the sensor cells 14, 16 include a membrane 24 and support structures to support the membrane 24 above the substrate 12. In this example, the support structures include bases 26 and pedestals 28 extending from the bases 26 to support the membrane 24. Each base 26 may be disposed on the surface of the substrate 12 to act as a footer or foundation for the membrane 24. The sensor cells 14, 16 may share an inner one of the bases 26 as shown. Each pedestal 28 may extend upward to space the membrane 24 from the substrate 12. In this example, each pedestal 28 supports a respective end of one of the membranes 24 to suspend a central segment or portion of the membrane 24 over the substrate 12. The central segment of each membrane 24 may be bar-shaped, although other shapes may be used. The shape, arrangement, and other characteristics of the bases 26 and the pedestals 28 may thus vary from the example shown to accommodate other membrane configurations.

The pedestals 28 and the membrane 24 of each cell 14, 16 may be integrally formed. For example, one or more layers of polysilicon may be deposited to form each of the pedestals 28 and membranes 24. In one embodiment, each pedestal 28 may be formed from a polysilicon layer having a thickness of about 2 microns, although other thicknesses, materials, and configurations may be used.

Each base 26 may include a dielectric material, e.g., silicon-rich silicon nitride, for isolation of the electrodes of the sensor cells 14, 16. The thickness of the silicon nitride layer may be about 0.5 microns, although other thicknesses may be used. Each base 26 may also include a polysilicon or other conductive region to establish an electrical connection with the membrane 24.

The membrane 24 may have a thickness of about 2 microns, but other thicknesses may be used. The shape, construction, and other characteristics of the membrane 24 may vary. For example, the membrane 24 may be a composite structure including any number of layers or materials. In some cases, the layers include both conductive and non-conductive layers. The membrane 24 may alternatively or additionally be patterned to define a conductive or electrode section, which may be disposed on an inward face of the membrane 24.

Each sensor cell 14, 16 may include a fixed plate electrode 30 disposed on the surface of the substrate 12 beneath the membrane 24. The fixed plate electrode 30 is spaced from the membrane 24 to define a capacitive spacing or gap that varies during operation. The fixed plate electrode 30 may include polysilicon or other conductive material. The fixed plate electrode 30 may be biased at a voltage relative to the membrane 24 via one of the interconnects 18. The spacing between the membrane 24 and the substrate 12 may be about 0.4 microns, but other gap sizes may be used.

Each membrane 24 is released from the substrate 12 before sawing along the scribe lines 22. The release process may include an etching process in which a sacrificial layer disposed between the fixed plate electrode 30 and the membrane 24 is removed. In some embodiments, the etching process is configured as a wet etch for removal of a sacrificial silicon dioxide layer. Other materials may be used for the sacrificial layer. In some cases, a dry etch process is used to remove the sacrificial layer.

The gap between the substrate 12 and each membrane 24 is sealed after membrane release. The gap is sealed with one or more dielectric layers. In this example, a lower dielectric layer 32 (e.g., silicon oxide) is deposited on the sensor structures, followed by an upper dielectric layer 34 (e.g., silicon nitride) on the lower dielectric layer 32. The lower dielectric layer 32 may be formed with tetraethyl orthosilicate (TEOS). In one embodiment, the lower and upper dielectric layers 32, 34 have respective thicknesses of about 2.3 microns and 0.8 microns, although other thicknesses may be used.

The dielectric layers 32, 34 are patterned to completely cover and laterally surround the sensor structures of the reference sensor cell 16. The dielectric layers 32, 34 cover the membrane 24 of the reference sensor cell 16 so that the ambient pressure level does not deflect the membrane 24 toward the fixed plate electrode 30. A reference pressure level may thus be provided.

The dielectric layers 32, 34 also laterally surround the sensor structures of the sensor cell 14. The dielectric layers 32, 34 are disposed along a periphery of the sensor cell 14. In the embodiment of FIG. 1, the dielectric layers 32, 34 are also disposed along a periphery of the membrane 24 of the sensor cell 14. The space between the membrane 24 and the substrate 12 may thus be sealed by the dielectric layers 32, 34. In some embodiments, the seal may be hermetic to support the operation of the sensor device 10 as, for instance, a pressure sensor device.

An opening 35 is defined over the membrane 24 of the sensor cell 14. The patterning of the dielectric layers 32, 34 thus allow the spacing or gap of the sensor cell 14 to be sealed without adversely affecting the operation of the sensor device 10.

The sensor device 10 includes a polymer coating or layer 36 that covers the sensor structures of the sensor cells 14, 16. The polymer coating 36 covers the membrane 24 of the sensor cell 14. The polymer coating 36 may extend laterally across the sensor structures of the sensor cells 14, 16 to fill the opening 35 and cover the dielectric layers 32, 34. In some cases, the polymer coating 36 extends slightly beyond the sensor structures of the sensor cells 14, 16 to ensure uniform coverage of the membrane 24.

The polymer coating 36 protects the membrane 24 of the sensor cell 14. The membrane 24 would otherwise be exposed to the ambient due to the opening in the dielectric layers 32, 34 and further to the absence of a cap or other enclosure of the sensor device 10.

The protection is provided during fabrication of the sensor device 10. The polymer coating 36 is useful during a dicing process during which water impinges upon sensor device 10 as a saw blade cuts through the substrate 12 along the scribe lines 22. The polymer coating 36 may act as a buffer. The membrane 24 may also be protected by the polymer coating 36 during subsequent handling, e.g., during die assembly. As described below, the polymer coating 36 may eventually be removed to allow the membrane 24 to be directly exposed to the ambient. In other cases, the membrane 24 remains covered by the polymer coating 36 during use and operation, i.e., after the assembly and fabrication of the sensor device 10 is complete.

The polymer coating 36 may be configured to dampen vibrations of the membrane 24 during the dicing process. The polymer coating 36 may have a thickness over the membrane 24 of about 3 to about 4 microns, or more, although other thicknesses may be used. For example, an increased thickness may be used to further dampen the vibrations and/or provide further buffering from the water.

In the embodiment of FIG. 1, the polymer coating 36 does not cover the bond pads 20 or the scribe lines 22. The polymer coating 36 may be patterned to avoid coverage of the bond pads 20 and/or the scribe lines 22.

The patterning of the polymer coating 36 may vary to customize the lateral extent of the coverage. For example, the polymer coating 36 may be patterned to cover only the sensor cell 14. Less coverage may be useful in cases where the polymer coating 36 is removed through a plasma etch process. In another example, the polymer coating 36 is patterned such that the scribe lines 22 remain covered. The plasma etch may be an oxygen-based ($O_2$) plasma ash etch. Other plasma etch processes may be used.

The polymer coating 36 may include a photoresist material. A variety of photoresist materials may be used. For example, SUMIRESIST™ positive photoresist available from Sumitomo Chemical Co., Ltd., and SU-8 negative photoresist available from MicroChem Corp. may be used as the photoresist material. Alternative or additional photoresist materials may be used. The photoresist material of the polymer coating 36 may be processed in accordance with a conventional photolithography procedure. For example, the photoresist material may be pre-baked before exposure and/or hard baked, as described below.

In other embodiments, the polymer coating 36 may include non-photoresist polymer materials. For example, a parylene or polyimide material may be used. In these embodiments, the polymer coating 36 may not be patterned, but instead form a universal coating over the wafer. The polymer coating 36 may be removed after dicing but before die bond. In other cases, the polymer coating 36 may be patterned in a conventional manner. In these and other cases, the polymer coating 36 may be removed either before die bond or after die bond.

The substrate 12 may include a semiconductor substrate. A variety of semiconductor materials may be used, including elementary semiconductors, such as silicon (Si), and compound semiconductors, such as gallium arsenide (GaAs) and gallium nitride (GaN). Other compound and non-compound semiconductor materials may be used. In the embodiment of FIG. 1, the substrate 12 includes (or is diced from) a silicon wafer 38. Silicon dioxide layers 40, 42 are disposed on or along top and bottom sides of the silicon wafer 38, respectively. The silicon wafer 38 and the silicon dioxide layers 40, 42 are not drawn to scale, as the silicon dioxide layers 40, 42 may be about several microns thick, while the silicon wafer 38 may be hundreds of microns thick.

The silicon wafer 38 may be a bulk semiconductor wafer. Other types of semiconductor substrates may be used. For example, the silicon wafer 38 or, more generally, the substrate 12, may be configured as a semiconductor-on-insulator (SOI) substrate. In some cases, the substrate 12 is a composite substrate with any number of layers (e.g., a base layer and one or more epitaxial layers).

The substrate 12 may be bonded or otherwise attached to a handle or other wafer or substrate. For example, the substrate 12 may be bonded to an application-specific integrated circuit (ASIC) wafer.

Figure 2:
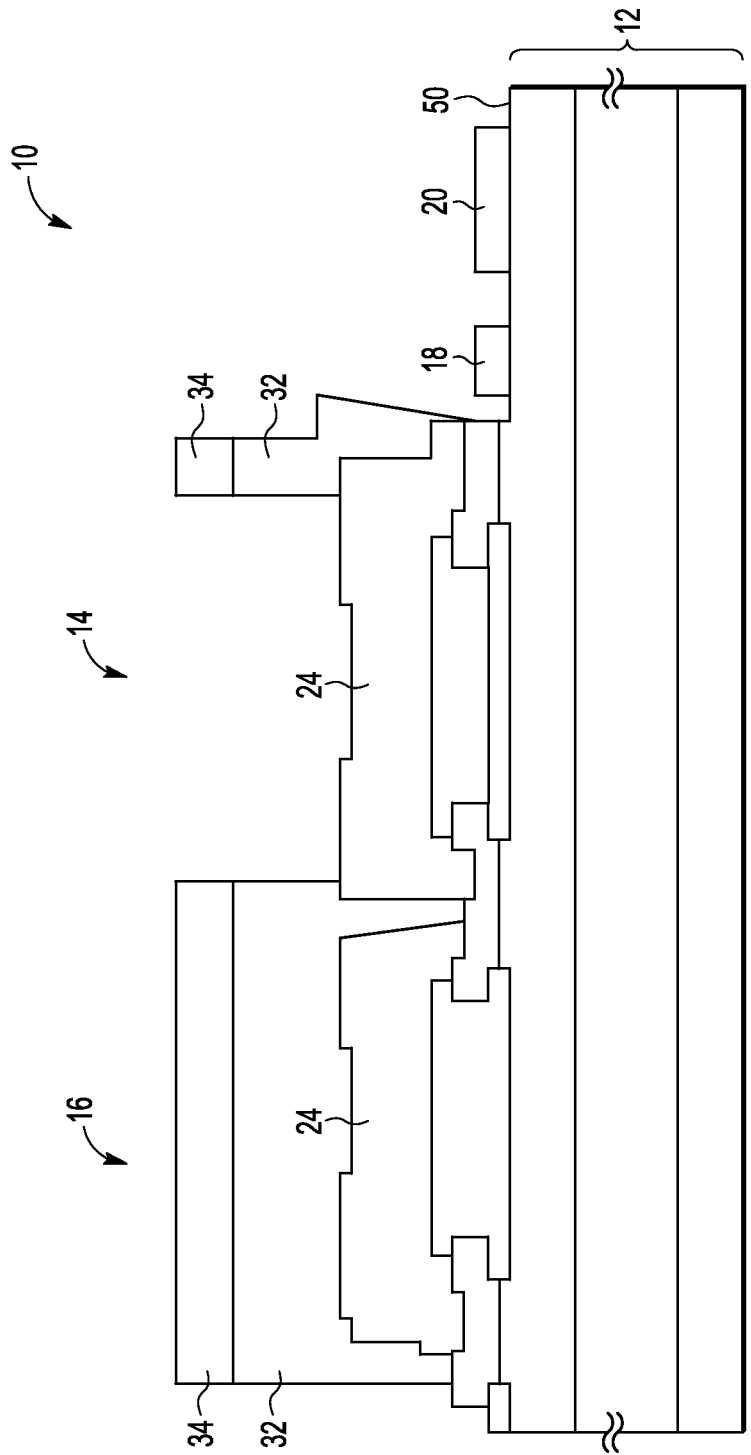
FIG. 2 is a schematic, simplified, cross-sectional view of the sensor device of FIG. 1 after a dicing process and removal of the polymer coating in accordance with one embodiment.

FIG. 2 depicts the sensor device 10 after the dicing process. In this embodiment, the polymer coating 36 (FIG. 1) has been removed from the opening 35 to expose the membrane 24 of the sensor cell 14 to the ambient. The polymer coating 36 is also removed from other sensor structures of the sensor device 10, such as the structures of the reference sensor cell 16, and the dielectric layers 32, 34 along the periphery of the membrane 24. The polymer coating 36 may be removed via a plasma or other etch process, including the $O_2$ plasma etch described herein.

The sensor device 10 is shown in simplified form. In some cases, the removal of the polymer coating 36 (FIG. 1) occurs after the implementation of die and other assembly procedures. However, bond wires and other assembly elements or packaging features of the sensor device 10 are not shown for ease in illustration.

As shown in FIG. 1, the substrate 12 has been sawed along the scribe line 22 (FIG. 1) to define a die 50 of the sensor device 10. The shape, size, and other characteristics of the die 50 may vary from the example shown. For example, edges of the die 50 need not be disposed adjacent the reference sensor cell 16 and the bond pad 20 as shown.

In other embodiments, the polymer coating 36 (FIG. 1) is not removed as shown in FIG. 2. The sensor structures of the sensor device 10, including the membrane 24, may remain covered by the polymer coating 36 during operation. In another example, a plasma or other etch process to remove the polymer coating 36 is configured to only remove part of the polymer coating 36. For example, the plasma etch process may be implemented for a shorter duration. The duration of the etch may be empirically or otherwise predetermined to achieve a desired thickness for the polymer coating 36. The thickness of the polymer coating 36 may thus be reduced to a level suitable for operation.

Figure 3:
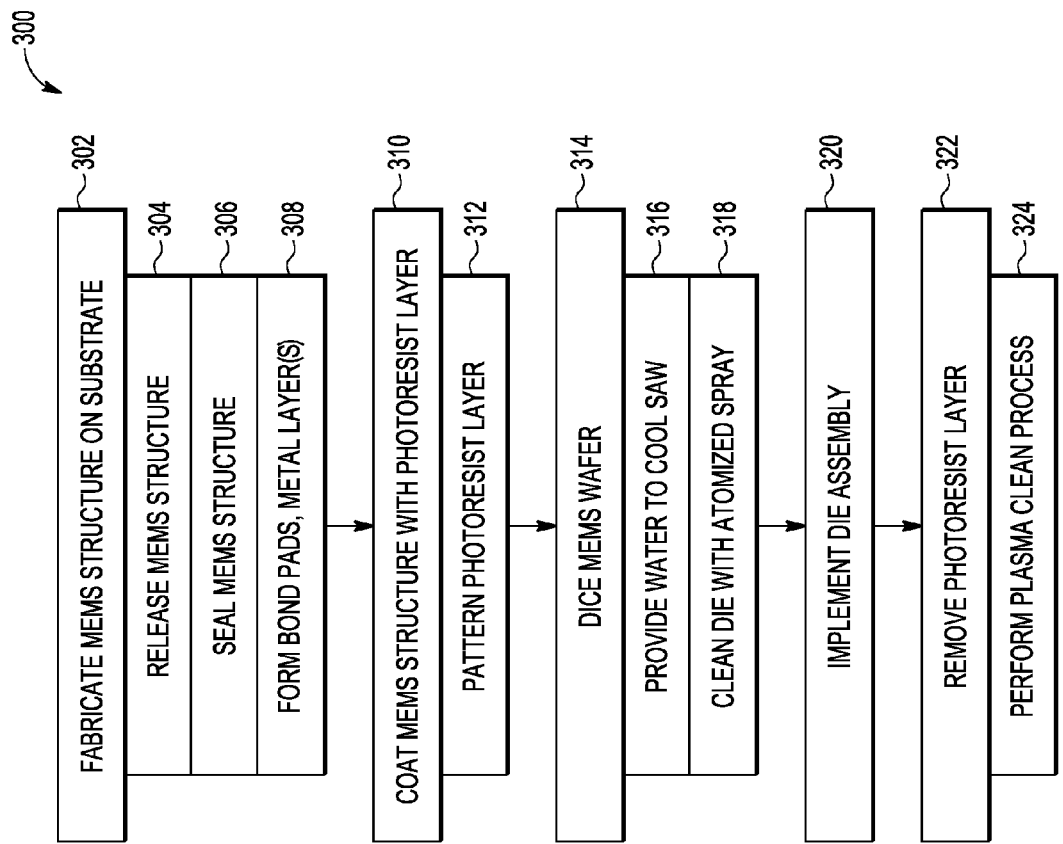
FIG. 3 is a flow diagram of an exemplary method of fabricating a sensor device in which a coating or layer of a polymer material is applied to reduce cracking during a sawing procedure in accordance with one embodiment.

FIG. 3 depicts a method 300 of fabricating a sensor device, such as the sensor devices described above. The fabrication method 300 includes the coverage of one or more sensor structures of the sensor device with a polymer coating to protect the structure(s) during fabrication. The method includes a sequence of acts or steps, only the salient of which are depicted for convenience in illustration. Additional, fewer, or alternative acts or steps may be implemented. For example, a gel coating act or procedure may be performed following the removal of the photoresist layer.

The method may begin with, or include, a number of fabrication procedures in an act 302 in which sensor structures (e.g., MEMS sensor structures) of a number of sensor devices are formed on a wafer or substrate. The sensor structures may be configured as described above. Each sensor structure may correspond with a pressure sensor diaphragm or other membrane of the sensor device. Additional sensor structures of each sensor device, such as the structures of a reference sensor cell, may also be covered. Conventional surface micromachining procedures may be used. For example, the fabrication procedures may include an act 304 in which the sensor structure (i.e., the diaphragm or other membrane) is released. The release procedure may include a wet or dry etch to remove, for instance, silicon dioxide, disposed between the sensor structure and the substrate. Other techniques for forming a membrane or other sensor structure spaced from the substrate may be used.

The fabrication procedures may also include an act 306 in which the released sensor structure(s) is sealed. A number of dielectric layers may be deposited in the act 306 along the periphery of the membrane or other sensor structure to seal the spacing or gap between the released sensor structure and the substrate. A number of bond pads and other conductive (e.g., metal) structures of each sensor device may be formed for each die (e.g., deposited on the wafer) in an act 308.

In an act 310, one or more sensor structures of each sensor device are coated or otherwise covered with a polymer layer. The act 310 may be performed as the final procedure before wafer dicing. For example, the coating occurs after any release and sealing performed in the acts 304, 306, as well as after formation of the bond pads and other conductive structures in the act 308.

The polymer layer may include a photoresist material. In some cases, the polymer layer may thus be applied in a manner conventional to photolithography procedures. For example, the polymer layer may be applied via a spin coating procedure. The polymer layer may be pre-baked to remove any excess solvent.

In some embodiments, covering the sensor structures includes patterning the polymer layer in an act 312. The polymer layer may be patterned such that the polymer layer does not cover the bond pad(s) for each die. Alternatively or additionally, the polymer layer may be patterned such that scribe lines along which the wafer is diced are not covered by the polymer layer. In some cases, coverage of the scribe lines may not be an issue if, for instance, the polymer material is sufficiently transparent or translucent.

The patterning may include conventional photolithography procedures. For example, the polymer layer may be subjected to a post-exposure bake before application of a developer. The portions of the polymer layer to be removed may be exposed (or not exposed) depending on whether positive or negative photoresist is used. The polymer layer may be subjected to a hard bake after exposure. The application and patterning of the polymer layer may include fewer, alternative, or additional procedures.

The wafer or substrate is then sawed or diced in an act 314 while the sensor structure(s) remain covered by the polymer layer. During the dicing process, water is provided to cool the saw blade in an act 316. The water may be applied in a cooling jet or spray. In some cases, the cooling jet is provided as an atomized spray. The polymer layer may act as a buffer between the water jet impinging upon the wafer and the sensor structure(s), such as a diaphragm or membrane. Notwithstanding such buffer protection, the pressure of the water jet used to cool the sawing blade may be reduced to a minimum level. The polymer layer may also provide protection from water applied for cleaning the wafer (and/or resulting die) in an act 318. The water used for cleaning may be provided as an atomized spray. The same and/or a different jet or spray may be used for saw cooling and wafer cleaning.

In an act 320, a die assembly procedure is implemented for the die created during the dicing process. In this embodiment, the die assembly procedure is implemented before removal of the polymer layer. The die assembly procedure may include one or more die bond processes. For example, each die may be wire bonded to a lead frame. Other assembly or packaging frameworks may be used. In some cases, contactless mounting procedures may be used to reduce the propensity for damage.

In some embodiments, the polymer layer is removed in an act 322. The polymer layer may be removed via a plasma etch process implemented in an act 324. One suitable plasma etch process is an $O_2$ plasma ash process. Other etch processes may be used. For example, in photoresist embodiments, the polymer layer may be removed with a conventional resist remover liquid.

The order of the acts described above may vary. For example, the polymer layer may be removed before die assembly if, for instance, protection beyond the dicing process is not warranted or desired.

In one aspect, a method of fabricating a sensor device includes forming a plurality of sensor structures on a wafer, covering the plurality of sensor structures with a polymer layer, and dicing the wafer into a plurality of die while each sensor structure remains covered by the polymer layer.

In a second aspect, a method of fabricating a sensor device includes forming a plurality of MEMS sensors on a wafer, each MEMS sensor including a diaphragm, covering the plurality of MEMS sensors with a polymer layer, patterning the polymer layer, and dicing the wafer into a plurality of die while each diaphragm remains covered by the patterned polymer layer.

In a third aspect, a MEMS sensor device includes a substrate, a support structure supported by the substrate, a diaphragm supported by the support structure and spaced from the substrate, and a polymer layer covering the diaphragm.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method of fabricating a sensor device, the method comprising:
    forming a plurality of sensor structures on a wafer;
    covering the plurality of sensor structures with a polymer layer;
    dicing the wafer into a plurality of die while each sensor structure remains covered by the polymer layer; and
    removing at least part of the polymer layer from each die after dicing the wafer.

2. The method of claim 1, wherein:
forming the plurality of sensor structures comprises forming a bond pad on the wafer for each die; and
covering the plurality of sensor structures comprises patterning the polymer layer such that the polymer layer does not cover the bond pad for each die.

3. The method of claim 1, wherein covering the plurality of sensor structures comprises patterning the polymer layer such that scribe lines along which the wafer is diced are not covered by the polymer layer.

4. The method of claim 1, wherein the polymer layer comprises a photoresist material.

5. The method of claim 1, wherein the polymer layer comprises a parylene material or a polyimide material.

6. The method of claim 1, wherein removing at least part of the polymer layer comprises performing an oxygen plasma ash etch process.

7. The method of claim 1, further comprising implementing a wire bonding procedure before removing the polymer layer.

8. The method of claim 1, wherein removing at least part of the polymer layer comprises implementing an etch procedure after dicing the wafer, the etch procedure being configured to reduce a thickness of the polymer layer.

9. The method of claim 1, further comprising implementing a gel coating procedure after removing the polymer layer.

10. The method of claim 1, wherein:
forming the plurality of sensor structures comprises forming a membrane for each die spaced from the wafer; and
covering the plurality of sensor structures comprises coating the membrane with the polymer layer.

11. The method of claim 10, wherein forming the plurality of sensor structures comprises releasing the membrane from a substrate before covering the plurality of sensor structures with the polymer layer.

12. The method of claim 11, wherein forming the plurality of sensor structures comprises depositing a dielectric layer to seal a space between the released membrane of each sensor structure and the wafer.

13. A method of fabricating a sensor device, the method comprising:
forming a plurality of microelectromechanical system (MEMS) sensors on a wafer, each MEMS sensor comprising a membrane;
covering the plurality of MEMS sensors with a polymer layer;
patterning the polymer layer;
dicing the wafer into a plurality of die while each membrane remains covered by the patterned polymer layer; and
removing at least part of the polymer layer from each die after dicing the wafer.

14. The method of claim 13, wherein:
each MEMS sensor comprises a bond pad on the wafer; and
patterning the polymer layer comprises removing the polymer layer from the bond pad of each MEMS sensor.

15. The method of claim 13, wherein patterning the polymer layer comprises removing the polymer layer from scribe lines along which the wafer is diced.

16. The method of claim 13, wherein the polymer layer comprises a photoresist material.

17. The method of claim 13, wherein removing at least part of the polymer layer comprises performing an oxygen plasma ash etch process.

18. The method of claim 13, further comprising implementing a wire bonding procedure before removing the polymer layer.

19. The method of claim 13, wherein forming the plurality of MEMS sensors comprises releasing the membrane from a substrate before covering the plurality of MEMS sensors with the polymer layer such that the membrane is suspended from the substrate.

20. The method of claim 13, wherein removing at least part of the polymer layer comprises implementing an etch procedure after dicing the wafer, the etch procedure being configured to reduce a thickness of the polymer layer.

* * * * *